United States Patent [19]

Moriya et al.

[11] Patent Number: 5,200,612
[45] Date of Patent: Apr. 6, 1993

[54] PHOTODETECTOR CARRIER FOR IMPROVING THE HIGH SPEED OF A PHOTODETECTOR AND METHOD FOR PRODUCING SAME

[75] Inventors: Kaoru Moriya, Kawasaki; Akira Okamoto, Higashikurume, both of Japan

[73] Assignee: Fujitsu Limited, Kawasaki, Japan

[21] Appl. No.: 620,830

[22] Filed: Dec. 3, 1990

[30] Foreign Application Priority Data

Dec. 8, 1989 [JP] Japan .................................. 1-317583

[51] Int. Cl.$^5$ .............................................. H01J 5/02
[52] U.S. Cl. .................................. 250/239; 250/214.1
[58] Field of Search ......................... 250/239, 211 R; 357/68 M, 74, 81; 174/167–174

[56] References Cited

U.S. PATENT DOCUMENTS

| | | | |
|---|---|---|---|
| 3,908,185 | 9/1975 | Martin | 357/68 M |
| 3,996,603 | 12/1976 | Smith | 357/68 M |
| 4,259,684 | 3/1981 | Dean et al. | 357/81 |
| 4,798,439 | 1/1989 | Preston | 357/81 |

*Primary Examiner*—David C. Nelms
*Assistant Examiner*—S. Allen
*Attorney, Agent, or Firm*—Staas & Halsey

[57] ABSTRACT

A photodetector carrier is disclosed which does not cause possible deterioration of an optical coupling characteristic between an optical fiber and a photodetector mounted on the carrier and is improved in high speed characteristics of the photodetector. The photodetector carrier is constructed by brazing to a metal plate of a ceramic substrate on which a photodetector mounting portion and a wiring pattern are formed. The photodetector carrier is fixed to a metal casing of a photodetector module by laser welding.

12 Claims, 6 Drawing Sheets

PHOTODETECTOR CARRIER FOR IMPROVING THE HIGH SPEED OF A PHOTODETECTOR AND METHOD FOR PRODUCING SAME

BACKGROUND OF THE INVENTION

This invention relates to a photodetector carrier and a photodetector module having such carrier.

On the receiving side of the common optical communication system, an optical signal transmitted by way of an optical transmission line (optical fiber) is photoelectrically converted to obtain an electric signal by means of a photodetector such as a photodiode, and information is reproduced with such electrical signal. A photodetector module which is used in such system includes a photodetector and an optical fiber arranged in a predetermined positional relationship. Since such photodetector is mounted onto a carrier made of a ceramic material or the like and then the carrier is fixed to a case of the photodetector module, a mounting structure of the photodetector carrier onto a case which has a superior aging characteristic under a high temperature circumstance is demanded in order to maintain an optical coupling characteristic between the optical fiber and the photodetector for a long period of time.

An extemplary one of conventional photodetector carriers is shown in FIG. 1. Referring to FIG. 1, a photodetector carrier 2 is made of a ceramic material, and a photodetector mounting portion 4 and wiring patterns 6 are formed on the photodetector carrier 2 by metallization. Further, a rear face 2a of the carrier 2 is processed by metallization over an entire area thereof in order to facilitate fixation of the carrier 2 to a case of a photodetector module.

Referring now to FIG. 2, there is shown a schematic view of the photodetector carried mounted on a case of a photodetector module in accordance with a known method. A photodiode (PD) chip 8 is die-bonded to the photodetector mounting portion 4 not shown in FIG. 2 of the carrier 2 by way of a soldering material such as AuSn having a melting point of 300° C. or while the carried 2 is secured by soldering to a case 12 by way of another solder having a melting point lower than that of the soldering material such as, for example, Sn-Pb eutectic solder. Reference numeral 10 denotes an optical fiber, and signal light from the optical fiber 10 is photoelectrically converted into an electric signal by the PD chip 8, and the electric signal is transmitted by way of the wiring patterns 6 and bonding wires not shown to another wiring pattern on a substrate not shown on which various electric parts not shown are mounted. The reason why the solder having a low melting point is employed for the fixation of the carrier 2 is that, since the carrier 2 is fixed to the case 12 after the PD chip 8 is mounted onto the carrier 2, if such solder having a low melting point is not employed for the fixation of the carrier 2, there is the possibility that the PD chip 8 which has been fixed once to the carrier 2 may come out of position.

Since such solder having a low melting point which is used for the fixation of the carrier 2 commonly exhibits a considerable creep, it is disadvantageous in that the aging characteristic thereof is interior under a high temperature environment. Such inferiority in aging characteristic will result in deterioration in optical coupling characteristic between the optical fiber and the PD chip. Further, according to the structure of the conventional carrier, a ceramic material having a dielectric constant $\epsilon$ is held between a wiring pattern and the case, and consequently, the carrier has an electric capacitance. Accordingly, the carrier has a disadvantage that such electric capacitance thereof will deteriorate the high speed characteristics of the PD chip.

SUMMARY OF THE INVENTION

Accordingly, it is an object of the present invention to provide a photodetector carrier which does not cause any deterioration in optical coupling characteristic between an optical fiber and a photodetector mounted on the carrier.

It is another object of the present invention to provide a photodetector carrier which improves the high speed characteristics of a photodetector.

It is a further object of the present invention to provide a photodetector module which does not cause any deterioration in optical coupling characteristic between an optical fiber and a photodetector mounted on a carrier and improves the high speed characteristics of the photodetector.

In accordance with an aspect of the present invention, there is provided a photodetector carrier, which comprises a ceramic substrate having a conductive photodetector mounting portion and a wiring pattern formed thereon, the ceramic substrate being partially metallized at a rear face thereof; and a metal plate brazed to the metallized portion of the rear face of the ceramic substrate, the metal plate being cut away at a portion thereof which correspond to the photodetector mounting portion and wiring pattern.

In accordance with another aspect of the present invention, there is provided a photodetector carrier, which comprises a ceramic substrate having a conductive photodetector mounting portion and a wiring pattern formed thereon, the ceramic substrate being metallized at the opposite end faces thereof; and a pair of metal plates brazed to the opposite end faces of the ceramic substrate such that ends thereof may be projected from a face of the ceramic substrate opposite to a face on which the photodetector mounting portion is formed.

Since the photodetector carrier of the present invention includes the metal plate brazed to the ceramic substrate, fixation of the carrier to a metal casing can be performed by laser welding. Consequently, the disadvantage of a conventional photodetector carrier that the aging characteristic under a high temperature environment is inferior can be eliminated, and a good optical coupling characteristic between an optical fiber and a photodetector can be maintained for a long period of time. Further, since either the metal plate is cut away at the portion thereof corresponding to the photodetector mounting portion and the wiring pattern or the metal plates are blazed to the opposite end faces of the ceramic substrate such that the ends thereof may be projected from the ceramic substrate, where the photodetector carrier is secured to a metal casing, an air layer is provided between the ceramic substrate and the metal casing, which is effective to minimize the electric capacity.

In accordance with a further aspect of the present invention, there is provided a photodetector module wherein the photodetector carrier of the construction described above is fixed to a metal casing by laser welding such that a surface of the ceramic substrate thereof and the surface of the ceramic substrate on which the electric part is mounted may be substantially in flush with each other, and the wiring pattern on the photodetector carrier and the wiring pattern on the ceramic substrate on which the electric part is mounted are interconnected by way of bonding wires.

The above and other objects, features and advantages of the present invention and the manner of realizing them will become more apparent, and the invention itself will best be understood, from a study of the following description and appended claims with reference had to the attached drawings showing some preferred embodiments of the invention.

DESCRIPTION OF THE PREFERRED EMBODIMENTS

Figure 1:
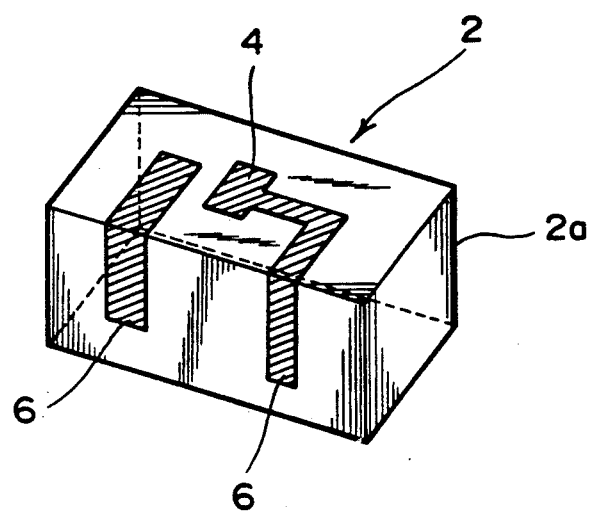
FIG. 1 is a perspective view of a conventional photodetector carrier.
Figure 2:
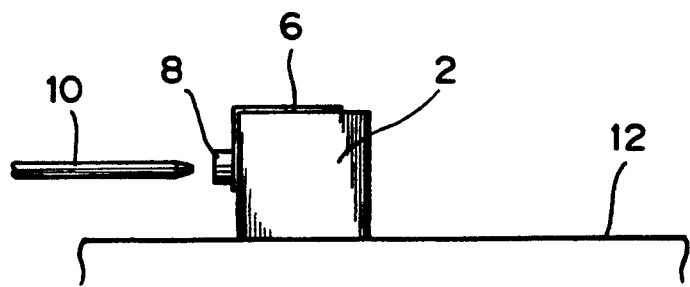
FIG. 2 is a schematic view showing the photodetector carrier mounted on a metal casing in accordance with a conventional method.

In the following, the present invention will be described in detail in connection with embodiments shown in the drawings.

Figure 3:
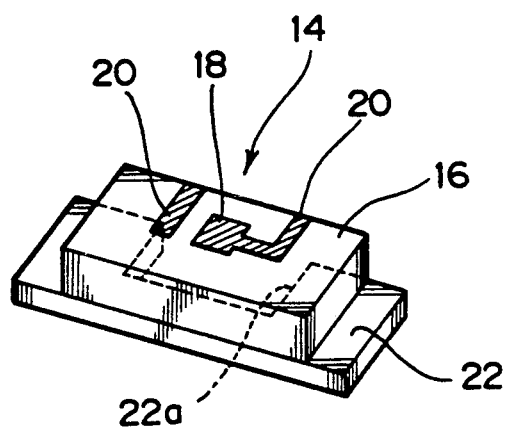
FIG. 3 is a perspective view of a photodetector carrier according to an embodiment of the present invention.

Referring first to FIG. 3, there is shown a perspective view of a photodetector carrier 14 according to an embodiment of the present invention. The photodetector carrier 14 includes a ceramic substrate 16 on which a conductive photodetector mounting portion 18 and wiring patterns 20 are formed by selective metallization of the ceramic substrate 16. The ceramic substrate 16 is partially metallized on a rear face thereof, and a metal plate 22 made of, for example, Kovar is brazed to the metallized rear face of the ceramic substrate 16 using a brazing material such as Ag-Cu. A recess or cutaway portion 22a is formed at a portion of the metal plate 22 which is opposed to the photodetector mounting portion 18 and wiring patterns 20 so that no or little electric capacitance may be provided between the wiring patterns 20 and the metal plate 22.

Figure 4:
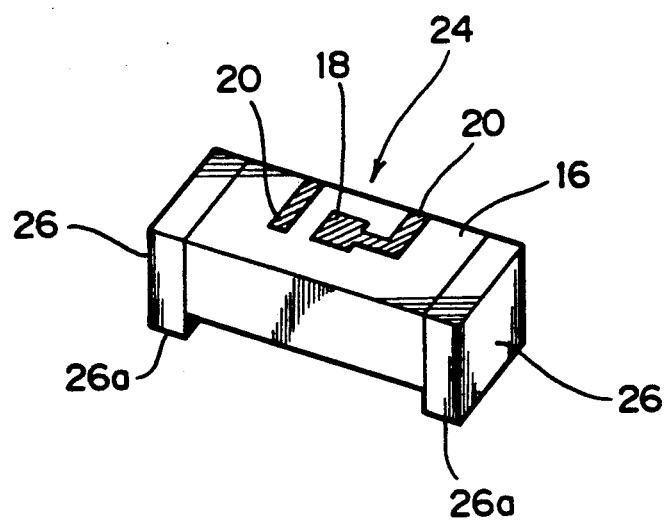
FIG. 4 is a prespective view of a photodetector carrier according to another embodiment of the present invention.

Referring now to FIG. 4, there is shown a perspective view of a photodetector carrier 24 according to another embodiment of the present invention. In the present embodiment, the ceramic substrate 16 is metallized on the opposite end faces thereof, and a metal plate 26 of Kovar or the like is brazed to each of the opposite end faces of the ceramic substrate 16 using a brazing material such as, for example, Ag-Cu. Each of the metal plates 26 is brazed to the ceramic substrate 16 such that an end portion 26a thereof may be projected a little from the rear face of the ceramic substrate 16.

Figure 5A:
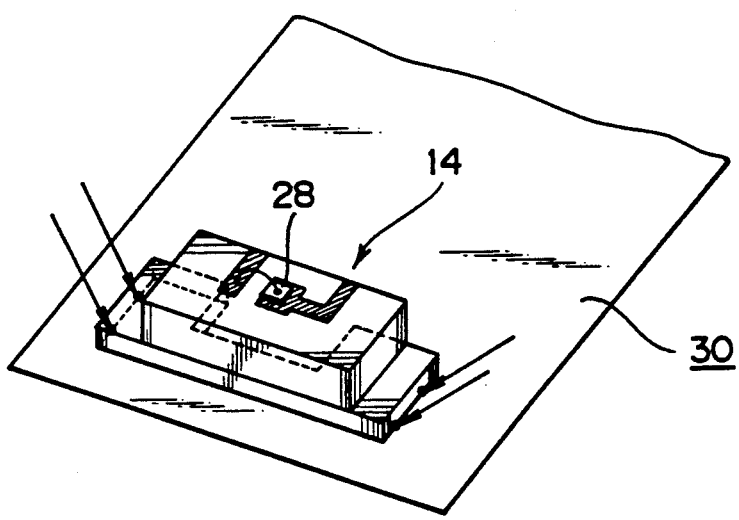
FIG. 5A is a schematic perspective view illustrating a manner of laser welding the photodetector carrier of FIG. 3.
Figure 5B:
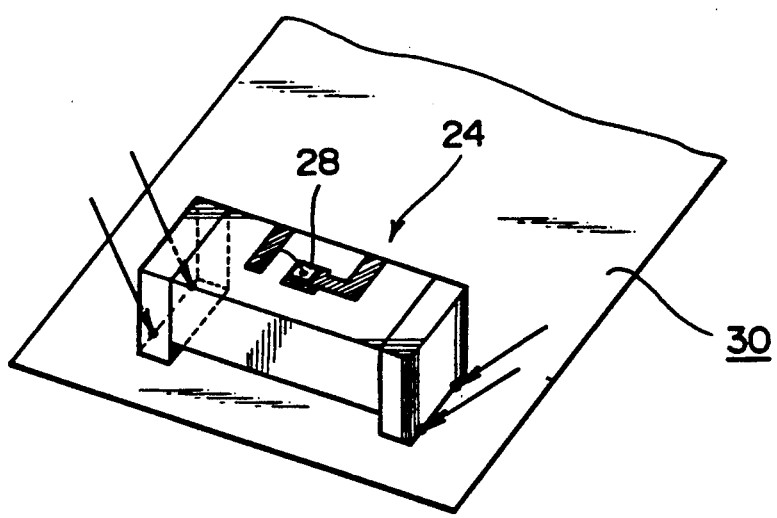
FIG. 5B is a similar view but illustrating a manner of laser welding the photodetector carrier of FIG. 4.

Referring subsequently to FIG. 5A, a PD chip 28 is mounted on the carrier 14 of FIG. 3 by means of a soldering material such as, for example, AuSn, and the carrier 14 is laser-welded as indicated by arrow marks to a case 30 of a photodetector module. On the other hand, referring to FIG. 5B, a PD chip 28 is mounted on the photodetector carrier 24 shown in FIG. 4, and the photodetector carrier 24 is mounted on a case 30 of a photodetector module. With either of the arrangements shown in FIGS. 5A and 5B, since an air layer is provided between the case 30 and the wiring patterns 20 on the ceramic substrate 16, the electric capacitance is minimized.

Figure 6:
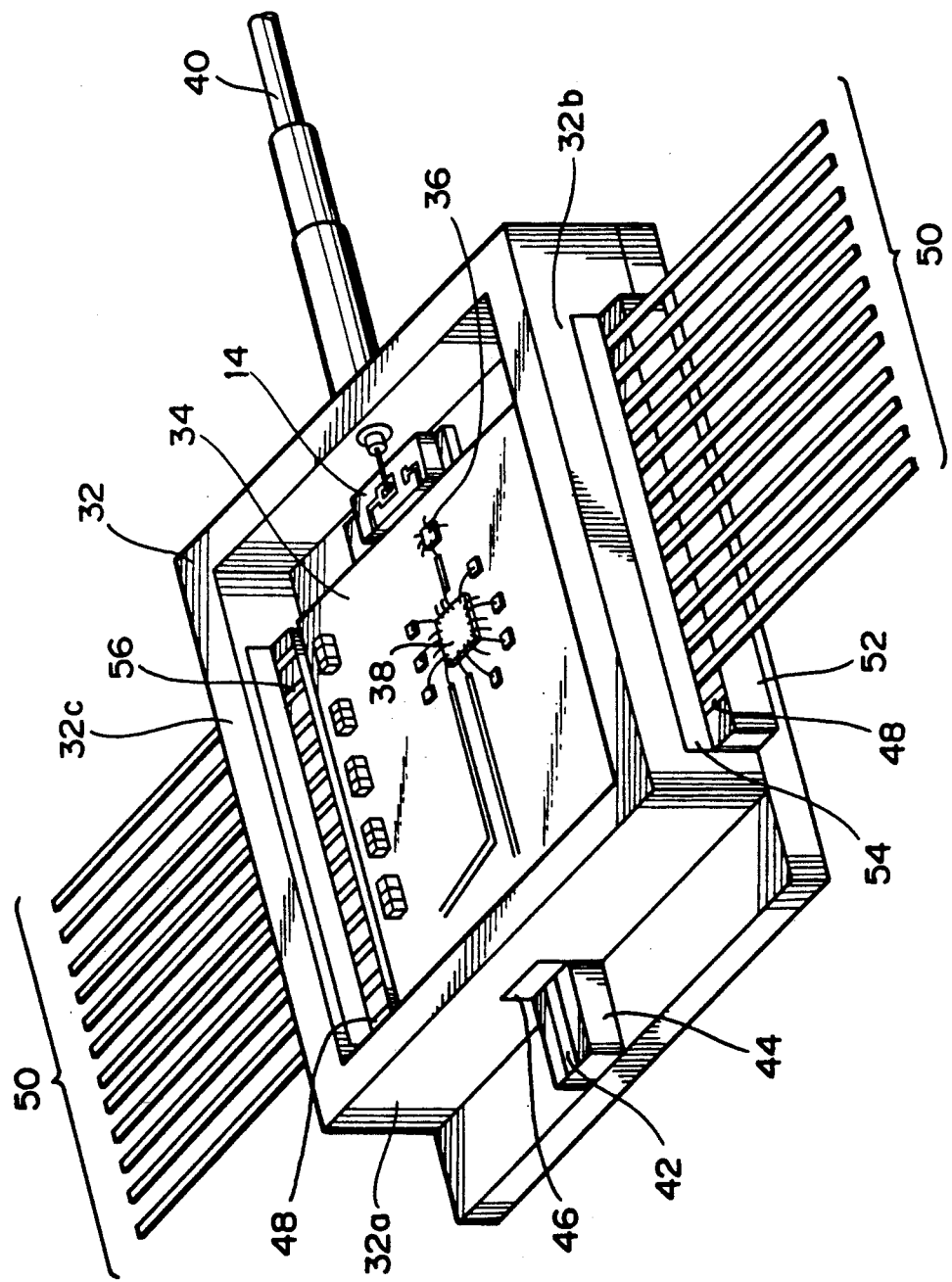
FIG. 6 is a perspective view of a photodetector module according to a further embodiment of the present invention.

Referring now to FIG. 6, there is shown a perspective view of entire construction of a photodetector module which employs either of such photodetector carriers as described above. The photodetector module includes a ceramic substrate 34 disposed in a case 32 made of Kovar. Several electric parts including a preamplifier 36 and an equalizer 38 are mounted on the ceramic substrate 34. A photodetector carrier 14 according to the present invention is fixed by laser welding to a bottom wall of the case 32 such that signal light from an optical fiber 40 may be coupled to a PD chip mounted on the photodetector carrier 14. A high speed signal pattern 42 is formed on a ceramic substrate 44 and extends through a side wall 32a of the case 32. The high speed signal pattern 42 is sandwiched, at a portion thereof at the side wall 32a of the case 32, between the ceramic substrate 44 and a ceramic member 46. Another high speed signal pattern 48 and a plurality of dc voltage applying patterns 56 extend through different side walls 32b and 32c of the case 32, respectively. The high speed signal pattern 48 and the dc voltage applying patterns 56 are formed on a further ceramic substrate 52 and are sandwiched, at portions thereof at the side walls 32b and 32c of the case 32, between the ceramic substrate 52 and a ceramic member 54. A dc voltage applying terminal 50 is soldered to each of the dc voltage applying patterns 56.

Subsequently, a method of mounting the photodetector carrier 14 of the photodetector module of FIG. 6 will be described with reference to FIG. 7. A step 58 is provided on a bottom wall 32d of the case 32 in such a manner as to define an upwardly projected bottom wall portion 32e, and the electric part mounting substrate 34 is mounted on the bottom wall portion 32e of the case 32. The step 58 is provided so that a surface of the electric part mounting substrate 34 may be substantially in flush with an upper face of the photodetector carrier 14 mounted on the bottom wall 32d of the case 32. With the construction described just above, the length of bonding wires 60 for interconnecting the wiring patterns 20 on the photodetector carrier 14 and wiring patterns not shown on the electric part mounting substrate 34 can be reduced remarkably, which is advantageous in transmission of a high speed signal. Reference numeral 62 denotes a bare fiber, and the bare fiber 62 is polished, at an end thereof, to form an end face which is inclined by an angle of about 45 degrees so that a beam of light may be totally reflected to optically couple to the PD chip 28 by the inclined end of the bare fiber 62. The photodetector carrier 14 is secured at portions A thereof to the bottom wall 32d of the case 32 by laser welding.

Figure 7:
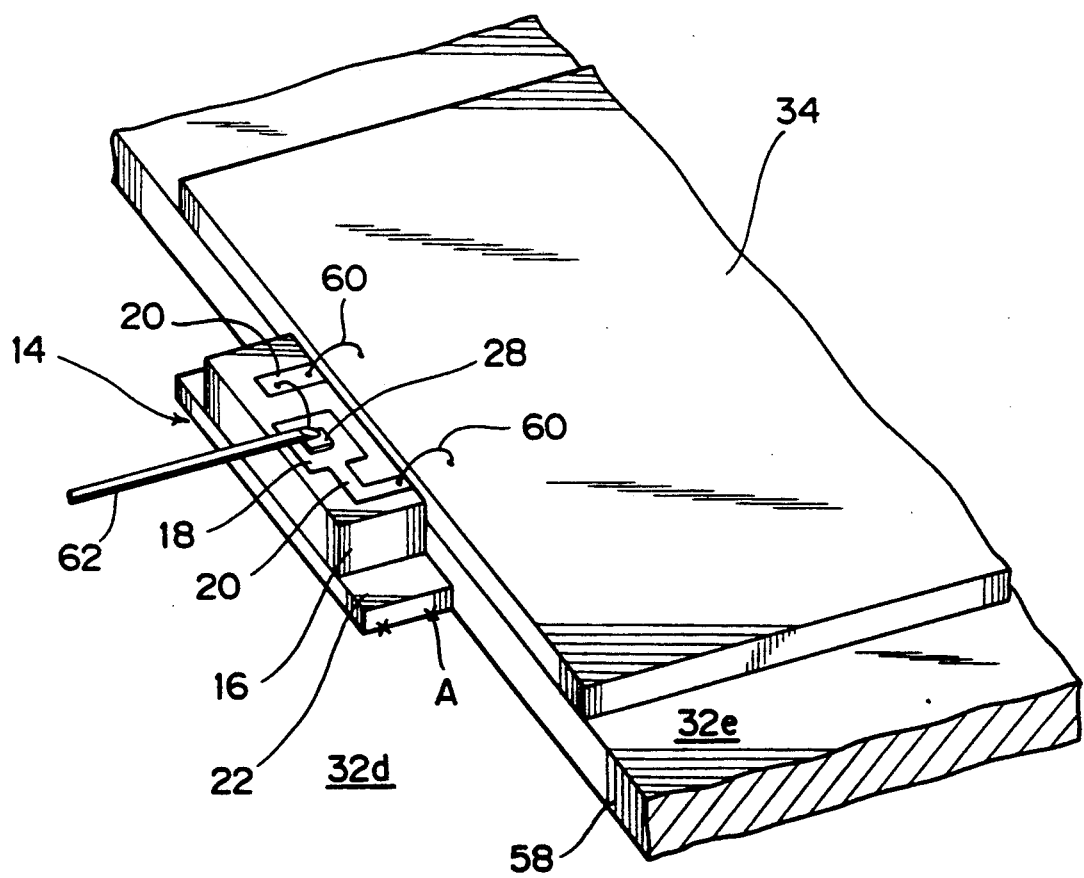
FIG. 7 is a schematic perspective view illustrating a manner of mounting a photodetector carrier of the photodetector module of FIG. 6.
Figure 8:
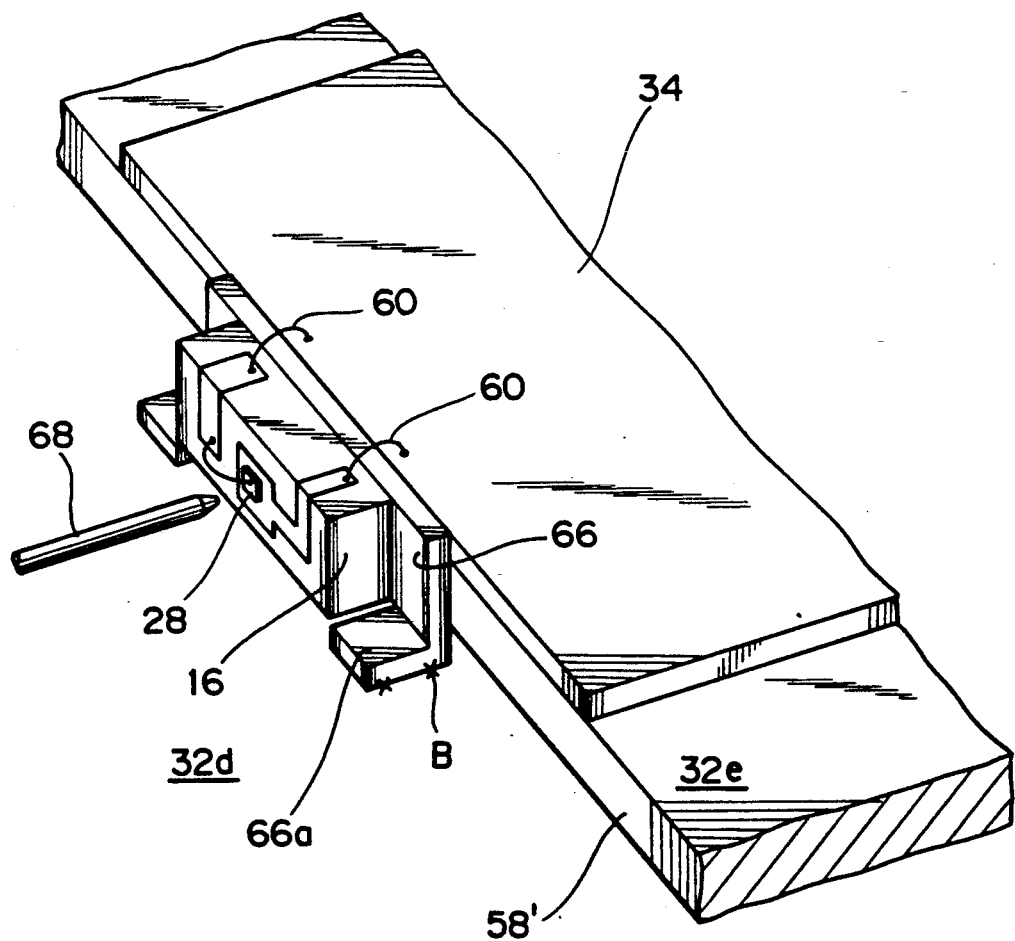
FIG. 8 is a similar view but illustrating another manner of mounting a photodetector carrier of the photodetector module of FIG. 6.

FIG. 8 illustrates a mounting method for fixing a photodetector carrier 64 perpendicularly to the electric part mounting substrate 34. In particular, the opposite end portions 66a of a metal piece 66 which is brazed to a rear face of the photodetector carrier 64 are bent laterally perpendicularly and is laser-welded at portions B thereof to the bottom wall 32d of the case to fix the photodetector carrier 64 to the bottom wall 32d. Reference numeral 68 denotes a tapered, round-ended fiber, and since the end portion of the fiber 68 has a tapered, round-ended shape, a beam of light can be coupled efficiently from the fiber 68 to the PD chip 28. In the mounting method illustrated in FIG. 8, since the photodetector carrier 64 is mounted perpendicularly to the electric part mounting substrate 34, a step 58' is formed with a greater height than the height of the step 58 of the arrangement shown in FIG. 7 in order to minimize the length of bonding wires 60.

While the mounting method of FIG. 7 is advantageous for high speed (electric) transmission of a signal, it is a problem that construction of the optical system is complicated. On the other hand, with the mounting method of FIG. 8, construction of the optical system can be made comparatively simple. It is preferable to select one of the mounting methods of FIGS. 7 and 8 in accordance with conditions of a band required for a photodetector module, a cost and so forth.

While the methods of mounting a photodetector illustrated in FIGS. 7 and 8 employ a photodetector carrier of such type as shown in FIG. 3, also a photodetector carrier of such type as shown in FIG. 4 can be fixed to a bottom wall of a metal casing of a photodetector module by laser welding.

According to the present invention described so far, since a photodetector carrier can be fixed rigidly to a casing by laser welding, possible deterioration of an optical coupling characteristic between an optical fiber and a photodetector mounted on the carrier can be prevented. Further, since the electric capacitance between the photodetector of a photodetector module and the casing can be restricted very low, the high speed characteristics of the photodetector can be improved.

What is claimed is:

1. A photodetector carrier, comprising:
a ceramic substrate having a conductive photodetector mounting portion and a wiring pattern formed thereon, said ceramic substrate being partially metallized at a rear face thereof; and
a metal plate brazed to the metallized portion of the rear face of said ceramic substrate, said metal plate being cut away at a portion thereof which corresponds to said photodetector mounting portion and said wiring pattern.

2. A photodetector carrier according to claim 1, wherein said metal plate is made of Kovar.

3. A photodetector carrier, comprising:
a ceramic substrate having a conductive photodetector mounting portion and a wiring pattern formed thereon, said ceramic substrate being metallized at opposite end faces thereof; and
a pair of metal plates brazed to the opposite end faces of said ceramic substrate such that ends thereof may be projected from a face of said ceramic substrate opposite to a face on which said photodetector mounting portion is formed.

4. A photodetector carrier according to claim 3, wherein said metal plate is made of Kovar.

5. A photodetector module, comprising:
a metal casing having a bottom wall and side walls;
a ceramic substrate carried on the bottom wall of said metal casing and having an electric part mounted thereon, said ceramic substrate having a wiring pattern formed thereon;
a photodetector carrier laser-welded to the bottom wall of said metal casing, said photodetector carrier including another ceramic substrate having a conductive photodetector mounting portion and a wiring pattern formed thereon, said another ceramic substrate being partially metallized at a rear face thereof, said photodetector carrier further including a metal plate brazed to the metallized rear face of said another ceramic substrate, said metal plate being cut away at a portion thereof which corresponds to said photodetector mounting portion and wiring pattern, said photodetector carrier being laser-welded to the bottom wall of said metal casing such that said another ceramic substrate of said photodetector carrier and said ceramic substrate on which said electric part is mounted may be substantially in flush with each other;
a photodetector mounted on said photodetector mounting portion of said photodetector carrier;
means for optically coupling signal light to said photodetector; and
means for interconnecting said wiring pattern on said photodetector carrier and said wiring pattern on said ceramic substrate on which said electric part is mounted.

6. A photodetector module according to claim 5, further comprising a high speed signal terminal and a plurality of dc voltage applying terminals connected to said wiring pattern formed on said ceramic substrate on which said electric part is mounted.

7. A photodetector module according to claim 5, wherein said interconnecting means includes a plurality of bonding wires.

8. A photodetector module, comprising:
a metal casing having a bottom wall and side walls;
a ceramic substrate carried on the bottom wall of said metal casing and having an electric part mounted thereon, said ceramic substrate having a wiring pattern formed thereon;
a photodetector carrier laser-welded to the bottom wall of said metal casing, said photodetector carrier including another ceramic substrate having a conductive photodetector mounting portion and a wiring pattern formed thereon, said another ceramic substrate being metallized at the opposite end faces thereof, said photodetector carrier further including a pair of metal plates brazed to the opposite end faces of said another ceramic substrate such that ends thereof may be projected from a face of said another ceramic substrate opposite to a face on which said photodetector mounting portion is formed, said photodetector carrier being laser-welded to the bottom wall of said metal casing such that said another ceramic substrate of said photodetector carrier and said ceramic substrate on which said electric part is mounted may be substantially flush with each other;
a photodetector mounted on said photodetector mounting portion of said photodetector carrier;

means for optically coupling signal light to said photodetector; and means for interconnecting said wiring pattern on said photodetector carrier and said wiring pattern on said ceramic substrate on which said electric part is mounted.

9. A photodetector module according to claim 8, further comprising a high speed signal terminal and a plurality of dc voltage applying terminals connected to said wiring pattern formed on said ceramic substrate on which said electric part is mounted.

10. A photodetector module according to claim 8, wherein said interconnecting means includes a plurality of bonding wires.

11. A method of mounting a photodetector to a metal casing, comprising the steps of:

a) providing a rectangular ceramic substrate having a front face and a rear face;

b) forming a conductive photodetector mounting portion and a wiring pattern on the front face of the ceramic substrate;

c) metallizing a portion of the rear face of the ceramic substrate;

d) brazing the ceramic substrate at the metallized portion to a metal plate having a portion cut away at a position corresponding to the photodetector mounting portion and the wiring pattern;

e) soldering the photodetector to the photodetector mounting portion of the ceramic substrate; and f) laser welding the metal plate to the metal casing.

12. A method of mounting a photodetector to a metal casing, comprising the steps of:

a) providing a rectangular ceramic substrate having a front face, a rear face and opposite end faces;

b) forming a conductive photodetector mounting portion and a wiring pattern on the front face of the ceramic substrate;

c) metallizing the opposite end faces of the ceramic substrate;

d) brazing a pair of metal plates to the opposite end faces of the ceramic substrate such that ends thereof are projected from the rear face of the ceramic substrate;

e) soldering the photodetector to the photodetector mounting portion of the ceramic substrate; and f) laser welding the metal plates to the metal casing.

* * * * *